(12) United States Patent
Lee

(10) Patent No.: US 7,413,944 B2
(45) Date of Patent: Aug. 19, 2008

(54) CMOS IMAGE SENSOR AND METHOD OF MANUFACTURING THE SAME

(75) Inventor: Sang Gi Lee, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 303 days.

(21) Appl. No.: 11/320,680

(22) Filed: Dec. 30, 2005

(65) Prior Publication Data

US 2007/0063235 A1     Mar. 22, 2007

(30) Foreign Application Priority Data

Sep. 21, 2005 (KR) .................. 10-2005-0087602

(51) Int. Cl.
*H01L 21/8238* (2006.01)

(52) U.S. Cl. ............... 438/199; 257/204; 257/E21.632; 257/E27.046

(58) Field of Classification Search ............. 257/173, 257/204, 357, 274; 438/199
See application file for complete search history.

(56) References Cited

U.S. PATENT DOCUMENTS 6,498,357 B2 * 12/2002 Ker et al. ................ 257/173

* cited by examiner

*Primary Examiner*—Quoc D Hoang
(74) *Attorney, Agent, or Firm*—McKenna Long & Aldridge LLP

(57) ABSTRACT

In a CMOS image sensor manufacturing process, heavily doped p type impurity ions (for example, B) are implanted in a dummy moat region when the heavily doped p type impurity ions is implanted in a PMOS transistor region, so that metal ion contamination is removed. Accordingly, a CMOS image sensor capable of reducing a leakage current by gettering metal ion contamination is provided.

7 Claims, 8 Drawing Sheets

CMOS IMAGE SENSOR AND METHOD OF MANUFACTURING THE SAME

CROSS-REFERENCE TO RELATED APPLICATION

This application claims the benefit of Korea Patent Application No. P2005-087602 filed on Sep. 21, 2005, which is hereby incorporated by reference for all purposes as if fully set forth herein.

BACKGROUND OF THE INVENTION

1. Field of the Invention

The present invention relates to an image sensor, and more particularly, to a CMOS image sensor capable of reducing a leakage current by gettering metal ion contamination by implanting p type impurity ions in a dummy moat region and a method of manufacturing the CMOS image sensor.

2. Description of the Related Art

In general, image sensors are a semiconductor device for converting an optical image to an electrical signal. Among the image sensors, a charge coupled device (CCD) is a device in which individual MOS (Metal-Oxide-Silicon) capacitors are closely disposed to each other, and charge carriers are stored in the capacitors.

A CMOS image sensor is a switching type device in which MOS transistors corresponding to the number of pixels are formed by using a CMOS technique employing a control circuit and a signal processing circuit as peripheral circuits and outputs are sequentially detected.

In the CCD device the driving mechanism is complicated and power consumption is large. In addition, since the number of mask process steps is large, the process to fabricate it is complicated. Since a signal processing circuit cannot be disposed in the CCD chip, it is also difficult to form the CCD device in form of one Chip. Recently, in order to solve the aforementioned problems, a CMOS image sensor using a sub-micron CMOS manufacturing technique has been researched and developed.

The CMOS image sensor is constructed by disposing a photodiode and a MOS transistor in each of unit pixels and sequentially detects signals in the switching scheme to form an image. Since the CMOS manufacturing technique is used, power consumption is small. In addition, since the number of masks is about 20, the process is very simple in comparison to the CCD process requiring 30 to 40 masks. Various signal processing circuits can be constructed on one chip. Therefore, attention has been paid to the CMOS image sensor as a next-generation image senor. The CMOS image sensor has been widely used in many applications such as DSCs (Digital Still Cameras), PC cameras, and mobile cameras.

A conventional method of a CMOS image sensor will now be described in detail with reference to the accompanying drawings.

FIGS. 1A to 1G are cross sectional views of a semiconductor device showing a conventional method manufacturing a CMOS image sensor.

As shown in FIG. 1A, element isolation films 32 are formed in a field region of a semiconductor substrate 31 having an active region, the field region, and a dummy moat region.

Here, the element isolation film 32 is formed by using an STI (Shallow Trench Isolation) process for etching the field region of the semiconductor substrate 31 in a predetermined depth to form a trench and burying an insulating material in an inner portion of the trench.

The active region includes a PMOS transistor region and a NMOS transistor region, and a photodiode region is defined in the NMOS transistor region.

Next, a photodiode 33 is formed by implanting impurity ions having a conductivity type opposite to that of the semiconductor substrate 31 in the photodiode region of the semiconductor substrate 31.

Next, after a first photosensitive film 34 is applied on the entire surface of the semiconductor substrate 31, the first photosensitive film 34 is patterned so as to mask the PMOS transistor region excluding the NMOS transistor region the dummy moat region by using exposing and developing processes.

Subsequently, by using the patterned first photosensitive film 34 as a mask, p type impurity ions are implanted in the entire surface of the semiconductor substrate 31 to form a P-well region 35 in the NMOS transistor region and the dummy moat region.

As shown in FIG. 1B, the first photosensitive film 34 is removed, and after a second photosensitive film 36 is applied to the entire surface of the semiconductor substrate 31, the second photosensitive film 36 are selectively patterned so as to open the PMOS transistor region by using exposing and developing processes.

Next, by using the patterned second photosensitive film 36 as a mask, n type impurity ions are implanted in the PMOS transistor region to form the N-well region 37.

As shown in FIG. 1C, after the second photosensitive film 36 is removed, a gate insulating film 38 and a gate-electrode polysilicon film are sequentially formed on the semiconductor substrate 31.

Next, the poly silicon film and the gate insulating film 38 are selectively etched to form a gate electrode 39 in the semiconductor substrate 31 in the PMOS transistor region and the NMOS transistor region.

Next, after a third photosensitive film 40 is applied on the semiconductor substrate 31, the third photosensitive film 40 are selectively patterned so as to open the NMOS transistor region and the dummy moat region by using exposing and developing processes.

Next, by using the patterned third photosensitive film 40 as a mask, n type impurity ions are implanted in the P-well region 35 and the dummy moat region to form a lightly doped n type impurity region 41.

As shown in FIG. 1D, the third photosensitive film 40 is removed, and after a fourth photosensitive film 42 is applied to the entire surface of the semiconductor substrate 31, the fourth photosensitive film 42 is selectively patterned so as to open the PMOS transistor region by using exposing and developing processes.

Next, by using the patterned fourth photosensitive film 42 as a mask, lightly doped p type impurity ions are implanted in the N-well region 37 to form a lightly doped p type impurity region 43.

As shown in FIG. 4E, the fourth photosensitive film 42 is removed, and after an insulating film is deposited on the entire surface of the semiconductor substrate 31, an etchback process is performed to form insulating film sidewalls 44 on both sides of the gate electrode 39.

Next, after a fifth photosensitive film 45 is applied to the entire surface of the semiconductor substrate 31, the fifth photosensitive film 45 is selectively patterned so as to open the NMOS transistor region by using exposing and developing processes.

Subsequently, by using the patterned fifth photosensitive film 45 as a mask, heavily doped n type impurity ions (for example, As) are implanted in the P-well region 35 and the dummy moat region to form the heavily doped n type impurity region 46 and an N+ region 47 simultaneously.

As shown in FIG. 1F, the fifth photosensitive film 45 is removed, and after a sixth photosensitive film 48 is applied to the entire surface of the semiconductor substrate 31, the sixth photosensitive film 48 is selectively patterned so as to open the PMOS transistor region and the dummy moat region by using exposing and developing processes.

Next, by using the patterned sixth photosensitive film 48 as a mask, heavily doped p type impurity ions are implanted in the N-well region 37 to form the heavily doped p type impurity region 49.

As shown in FIG. 1G, after the sixth photosensitive film 48 is removed, a thermal treatment process is performed on the semiconductor substrate 301 to activate the impurity ions implanted in the semiconductor substrate 31.

In the following processes (not shown), a plurality of interlayer insulating films, metal wire lines, color filter layers, and micro lenses are formed on the semiconductor substrate 31, so that an image sensor is manufactured.

In the method of manufacturing the CMOS image sensor in the aforementioned conventional technique, there is the following problem.

Since the heavily doped n type impurity ions are implanted in the dummy moat region, gettering effect for the metal ions is too small to reduce the leakage current.

SUMMARY OF THE INVENTION

Accordingly, the present invention is directed to a CMOS image sensor and method of manufacturing the same that substantially obviates one or more of the problems due to limitations and disadvantages of the related art.

An advantage of the present invention is that provides a CMOS image sensor capable of reducing a leakage current by gettering metal ion contamination by implanting p type impurity ions (for example, B) in a dummy moat region and a method of manufacturing the CMOS image sensor.

Additional features and advantages of the invention will be set forth in the description which follows, and will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the invention, as embodied and broadly described, there is provided a CMOS image sensor comprising: an element isolation film formed in a field region of a semiconductor substrate where a photodiode region, first and second conductivity type transistor regions, the field region, and a dummy moat region are defined; a photodiode formed in the photodiode region of the semiconductor substrate; a first conductivity type well region and a second conductivity type well region formed in the first and second conductivity type transistor regions of the semiconductor substrate, respectively; a gate electrode formed on the semiconductor substrate in the first and second conductivity type transistor regions with a gate insulating film interposed; a lightly doped first conductivity type impurity region and a lightly doped second conductivity type impurity region formed in the second well region and the first well region at both sides of the gate electrode, respectively; a heavily doped first conductivity type impurity region and a heavily doped second conductivity type impurity region formed in the first well region and the second well region at both sides of the gate electrode, respectively; and a heavily doped first conductivity type third impurity region formed in the dummy moat region.

According to another aspect of the present invention, there is provided a method of manufacturing a CMOS image sensor, comprising steps of: forming an element isolation in a field region of a semiconductor substrate where a photodiode region, first and second conductivity type transistor regions, the field region, and a dummy moat region are defined; forming a photodiode in the photodiode region of the semiconductor substrate 1; forming a first conductivity type well region and a second conductivity type second well region by implanting first and second conductivity type impurity ions in the first and second conductivity type transistor regions of the semiconductor substrate, respectively; forming a gate electrode on the semiconductor substrate in the first and second conductivity type transistor regions with a gate insulating film interposed; forming a lightly doped first conductivity type impurity region and a lightly doped second conductivity type impurity region in the second well region and the first well region at both sides of the gate electrode, respectively; forming a heavily doped first conductive type impurity region and a heavily doped second conductivity type impurity region in the first well region and the second well region at both sides of the gate electrode, respectively; and forming a heavily doped first conductivity type third impurity region in the dummy moat region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principles of the invention. In the drawings.

DETAILED DESCRIPTION OF THE ILLUSTRATED EMBODIMENTS

Reference will now be made in detail to exemplary embodiments of the present invention, examples of which are illustrated in the accompanying drawings.

Figure 1A:
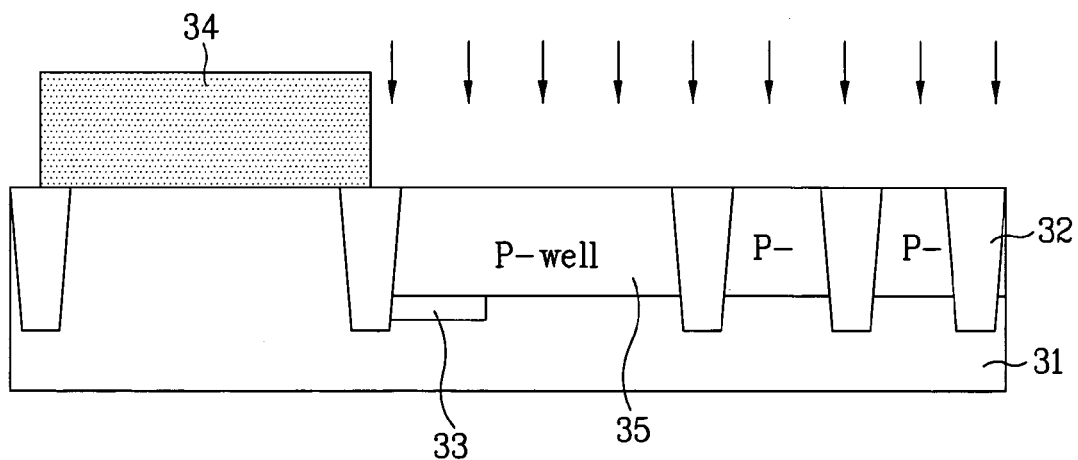
FIGS. 1A to 1G are cross sectional views of a CMOS image sensor showing a conventional method of manufacturing the CMOS image sensor.
Figure 1B:
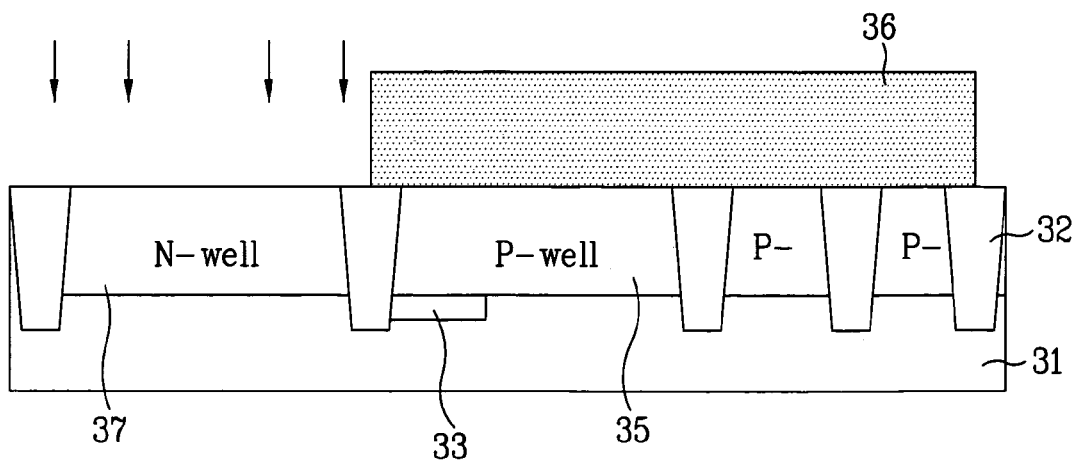
Figure 1C:
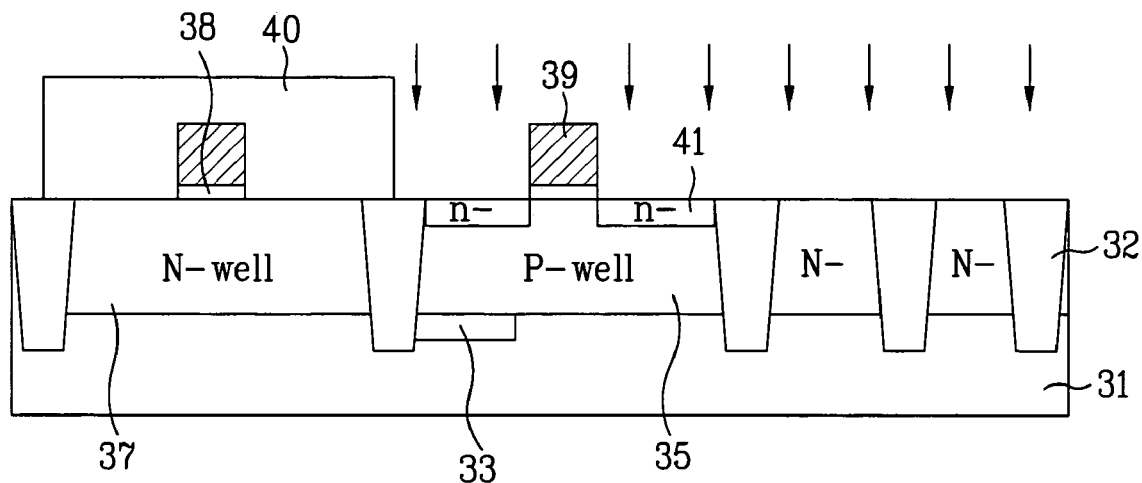
Figure 1D:
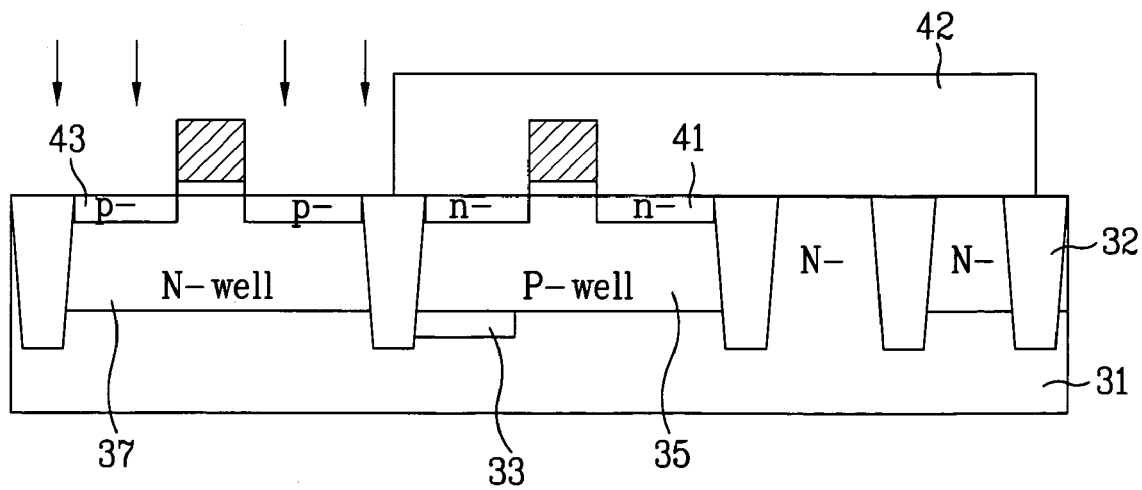
Figure 1E:
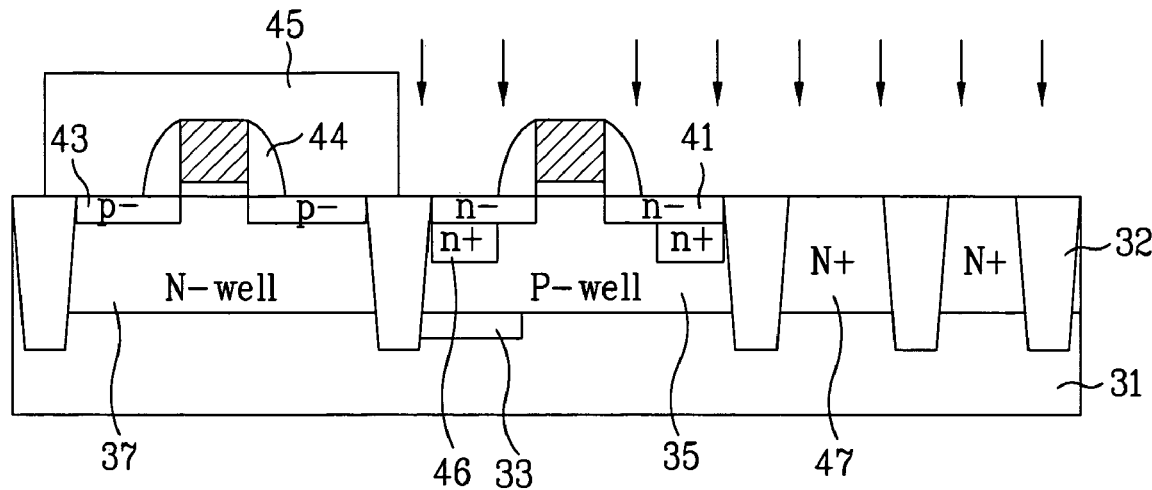
Figure 1F:
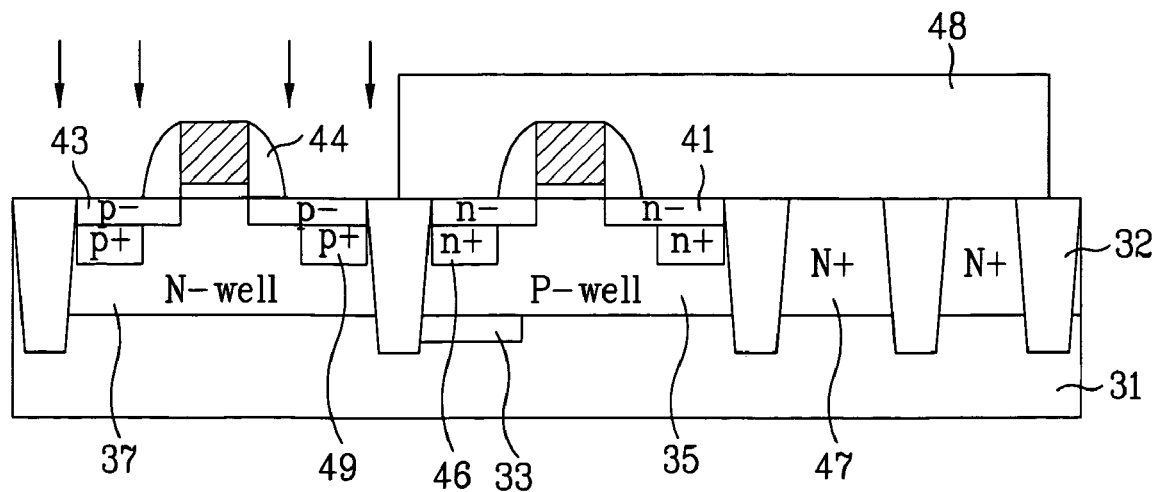
Figure 1G:
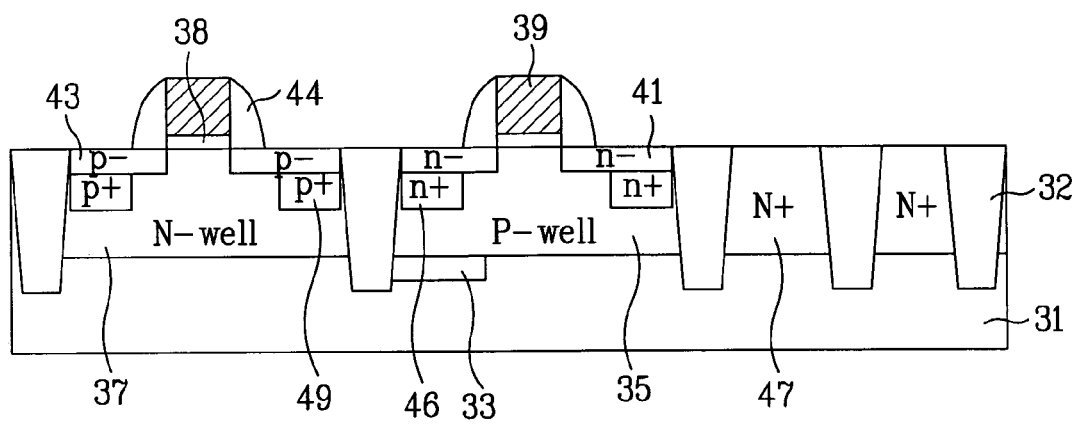
Figure 2:
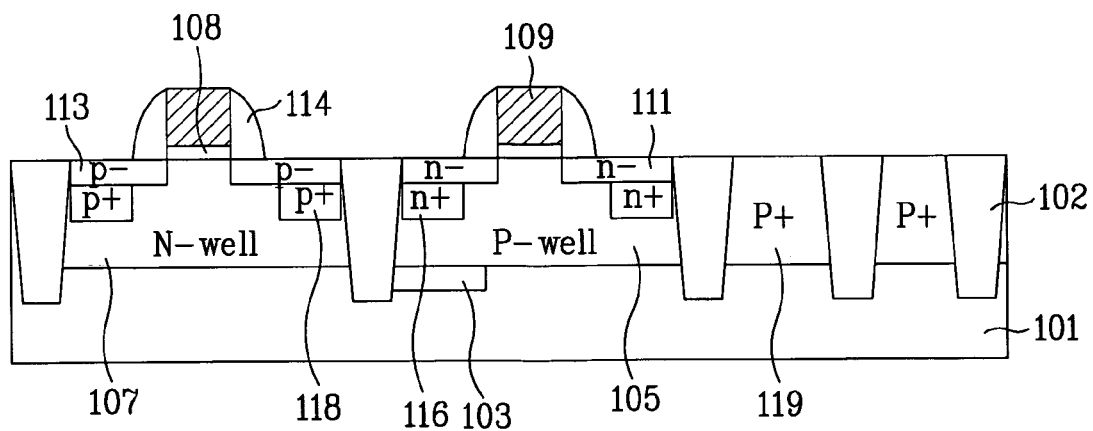
FIG. 2 is a schematic cross sectional view showing a CMOS image sensor according to an exemplary embodiment of the present invention.

FIG. 2 is a schematic cross sectional view showing a CMOS image sensor according to an exemplary embodiment of the present invention As shown in FIG. 2, the CMOS image sensor includes: an element isolation film 102 formed in a field region of a semiconductor substrate 101 where a photodiode region, PMOS and NMOS transistor regions, the field region, and a dummy moat region are defined; a photodiodes 103 formed in the photo region of the semiconductor substrate 101; an N-well region 107 and a P-well region 105 formed the PMOS and NMOS transistor regions of the semiconductor substrate 101, respectively; a gate electrode 109 formed on the semiconductor substrate 101 in the PMOS and NMOS transistor region of semiconductor substrate 101 with a gate insulating film 108 interposed therebetween; a lightly doped p type impurity region 113 and a lightly doped n type impurity region 111 formed in the N-well region 107 and the P-well region 105 at both sides of the gate electrode 109, respectively; insulating film sidewalls 114 formed on both sides of the gate electrode 109; a heavily doped p type impurity region 118 and a heavily doped n type impurity region 116 formed in the N-well region 107 and the P-well region 105 at both sides of the gate electrode 109 and the insulating film sidewall 114; and a P+ region 119 formed in the dummy moat region.

Boron is implanted into the P+ region 119.

FIGS. 3A to 3G are cross sectional views of a semiconductor device showing process steps of a method of manufacturing a CMOS image sensor according to an exemplary embodiment of the present invention.

Figure 3A:
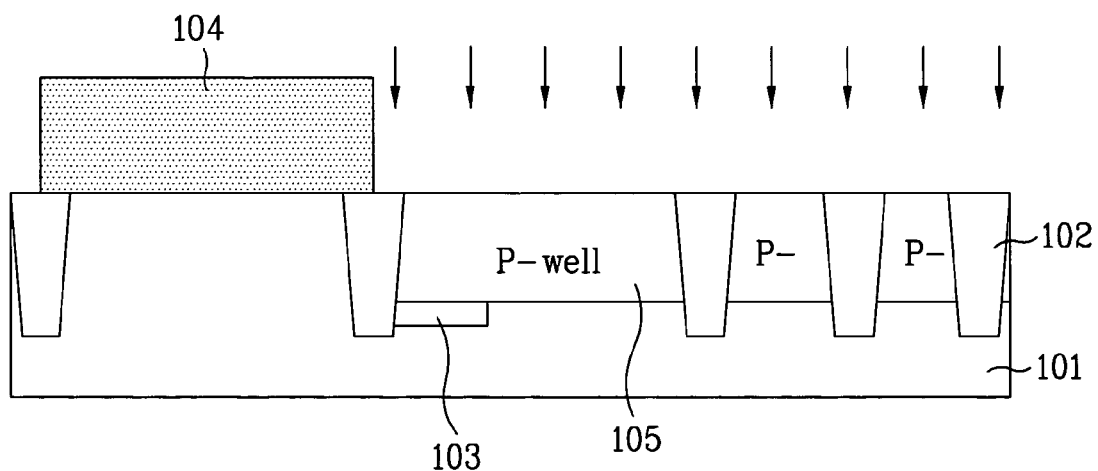
FIGS. 3A to 3G are cross sectional views of a CMOS image sensor showing process steps of a method of manufacturing a CMOS image sensor according to an exemplary embodiment of the present invention.

As shown in FIG. 3A, element isolation films 102 are formed in a field region of a semiconductor substrate 101 having an active region, the field region, and a dummy moat region.

Here, the element isolation film 102 is formed by using an STI (Shallow Trench Isolation) process for etching the field region of the semiconductor substrate 101 in a predetermined depth to form a trench and burying an insulating material in an inner portion of the trench.

On the other hand, the active region includes a PMOS transistor region and a NMOS transistor region, and a photodiode region is defined in the NMOS transistor region.

Next, a photodiode 103 is formed by implanting impurity ions having a conductive type opposite to that of the semiconductor substrate 101 in the photodiode region of the semiconductor substrate 101.

After a first photosensitive film 104 is applied on the entire surface of the semiconductor substrate 101, the first photosensitive film 104 is patterned so as to mask the PMOS transistor region excluding the NMOS transistor region the dummy moat region by using exposing and developing processes.

Subsequently, by using the patterned first photosensitive film 104 as a mask, p type impurity ions are implanted in the entire surface of the semiconductor substrate 101 to form a P-well region 105 in the NMOS transistor region and the dummy moat region.

Figure 3B:
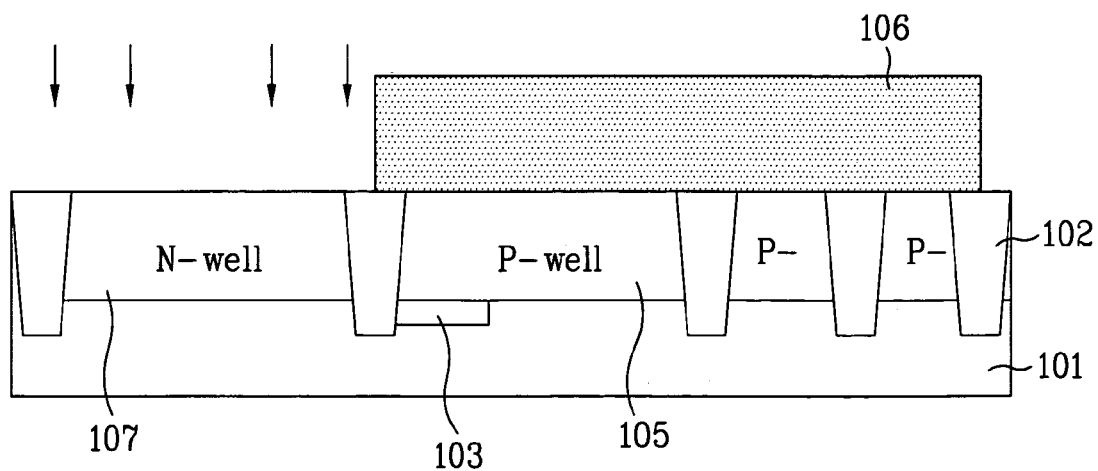

As shown in FIG. 3B, the first photosensitive film 104 is removed, and after a second photosensitive film 106 is applied to the entire surface of the semiconductor substrate 101, the second photosensitive film 106 is selectively patterned so as to open the PMOS transistor region by using exposing and developing processes.

Next, by using the patterned second photosensitive film 106 as a mask, n type impurity ions are implanted in the PMOS transistor region to form the N-well region 107.

Figure 3C:
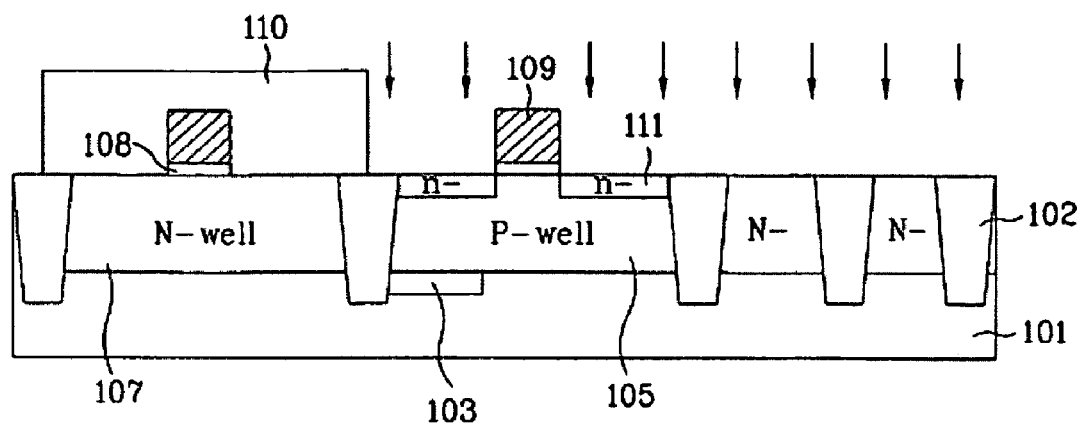

As shown in FIG. 3C, the second photosensitive film 106 is removed, a gate insulating film 108 and a gate-electrode conductive film (for example, a poly silicon film) are sequentially formed on the semiconductor substrate 101.

Next, the conductive film and the gate insulating film 108 are selected etched to form a gate electrode 109 on the semiconductor substrate 101 in the PMOS transistor region and the NMOS transistor region.

After a third photosensitive film 110 is applied on the semiconductor substrate 101, the third photosensitive film 110 is selectively patterned so as to open the NMOS transistor region and the dummy moat region by using exposing and developing processes.

Next, by using the patterned third photosensitive film 110 as a mask, n type impurity ions are implanted in the P-well region 105 and the dummy moat region to form a lightly doped n type impurity region 111.

Figure 3D:
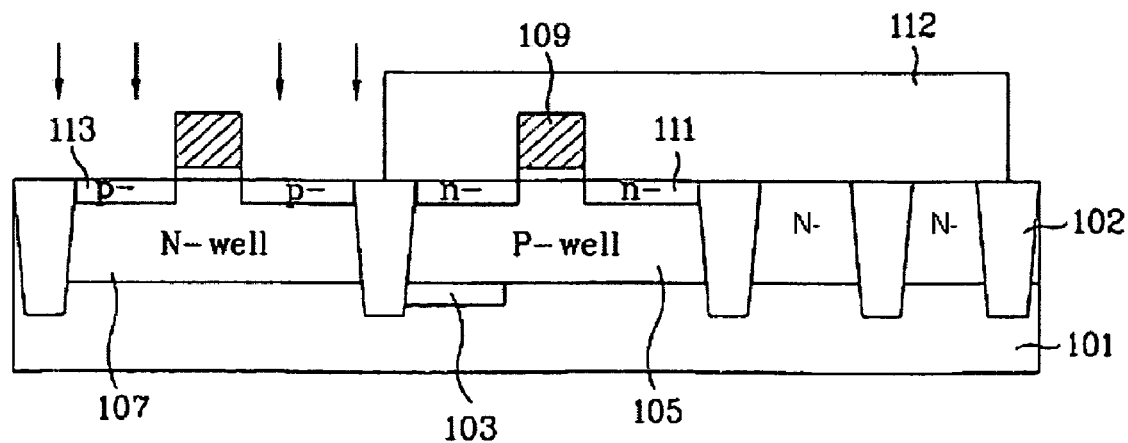

As shown in FIG. 3D, the third photosensitive film 110 is removed, and after a fourth photosensitive film 112 is applied to the entire surface of the semiconductor substrate 101, the fourth photosensitive film 112 is selectively patterned so as to open the PMOS transistor region by using exposing and developing processes.

Next, by using the patterned fourth photosensitive film 112 as a mask, lightly doped p type impurity ions are implanted in the N-well region 107 to form a lightly doped p type impurity region 113.

Figure 3E:
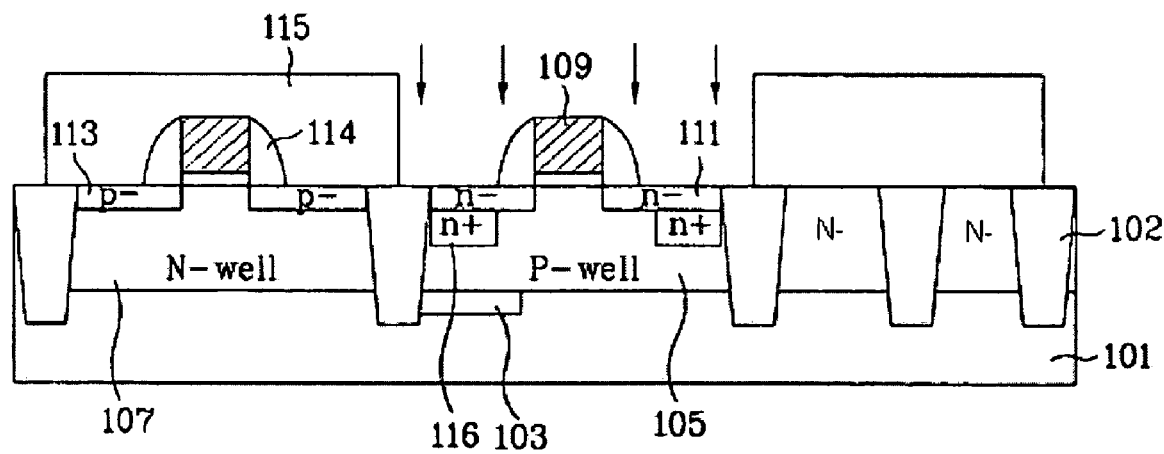

As shown in FIG. 3E, the fourth photosensitive film 112 is removed, and after an insulating film is deposited on the entire surface of the semiconductor substrate 101, an etchback process is performed to form insulating film sidewalls 114 on both sides of the gate electrode 109.

After a fifth photosensitive film 115 is applied to the entire surface of the semiconductor substrate 101, the fifth photosensitive film 115 is selectively patterned so as to open the NMOS transistor region by using exposing and developing processes.

Subsequently, by using the patterned fifth photosensitive film 115 as a mask, heavily doped n type impurity ions (for example, As) are implanted in the P-well region to form the heavily doped n type impurity region 116.

Figure 3F:
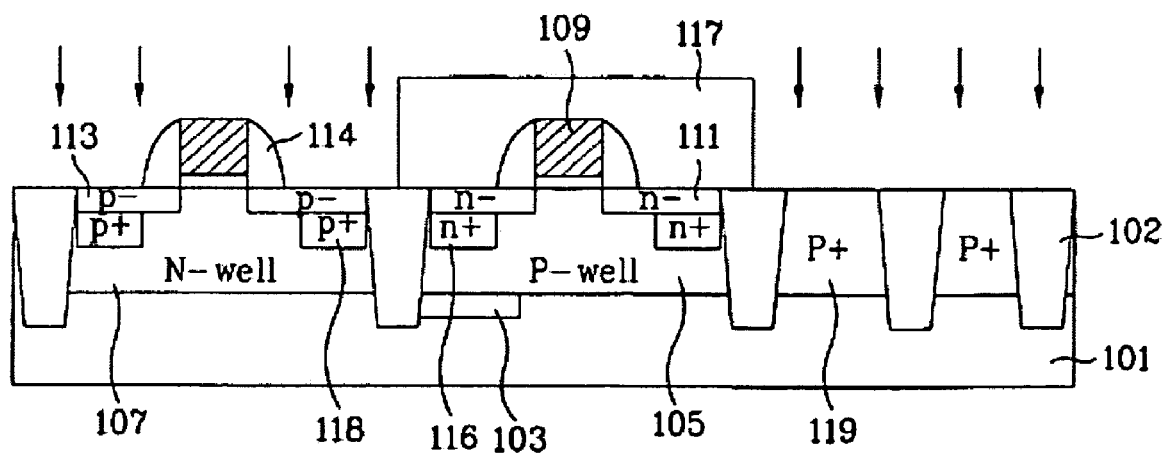

As shown in FIG. 3F, the fifth photosensitive film 115 is removed, and after a sixth photosensitive film 117 is applied to the entire surface of the semiconductor substrate 101, the sixth photosensitive film 117 is selectively patterned so as to open the PMOS transistor region and the dummy moat region by using exposing and developing processes.

Using the patterned sixth photosensitive film 117 as a mask, heavily doped p type impurity ions are implanted in the N-well region 107 and the dummy moat region to form the heavily doped p type impurity region 118 and the P+ region 119 simultaneously.

Figure 3G:
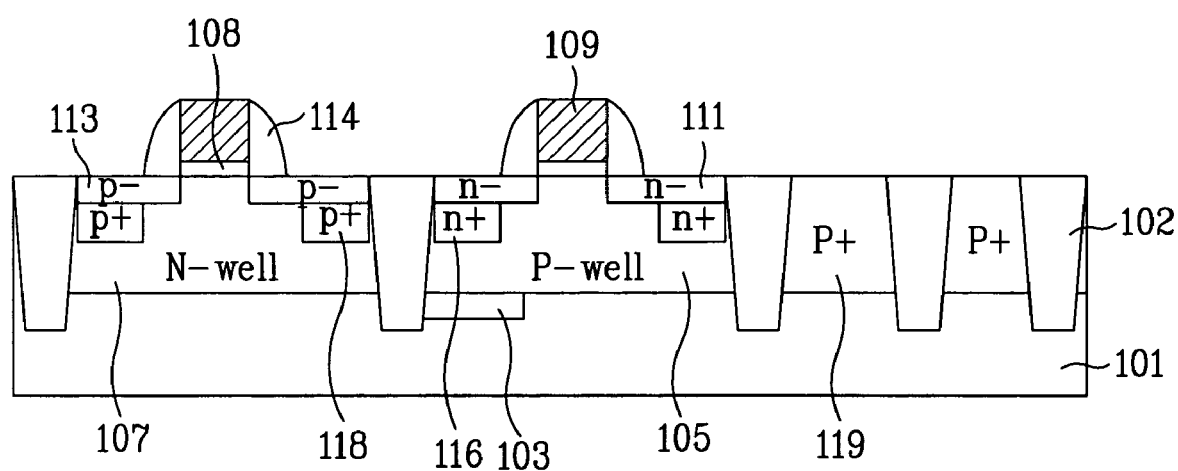

As shown in FIG. 3G, after the sixth photosensitive film 117 is removed, a thermal treatment process is performed on the semiconductor substrate 101 to activate the impurity ions implanted in the semiconductor substrate 101.

In the subsequent process steps (not shown), a plurality of interlayer insulating films, metal wire lines, color filter layers, and micro lenses are formed on the semiconductor substrate 101, so that an image sensor is manufactured.

According to an exemplary embodiment of the present invention, in the CMOS image sensor manufacturing process, when the heavily doped p type impurity ions (for example, B) are implanted in the PMOS transistor region, the heavily doped p type impurity ions are also implanted in the dummy moat region, so that metal ion contamination can be prevented.

In the conventional technique, when the N+ ions are implanted, arsenic (As) ions are implanted in the dummy moat region. However, according to an exemplary embodiment of the present invention, when the P+ ions are implanted, boron ions are implanted in the dummy moat region, so that the metal ion contamination can be prevented by using Fe—B bonding.

As a result, without an additional process, the metal ion contamination is subject to gettering in a wide area of the dummy moat region, so that a leakage current can be reduced.

Although the exemplary embodiments and the modified examples of the present invention have been described, the present invention is not limited to the embodiments and examples, but may be modified in various forms without departing from the scope of the appended claims, the detailed description, and the accompanying drawings of the present invention. Therefore, it is natural that such modifications belong to the scope of the present invention.

According to a CMOS image sensor and a method of manufacturing the CMOS image sensor of the present invention, the following advantages can be obtained.

A high concentration of boron ions can be implanted in a wide dummy moat region of the CMOS image sensor during a P+ source/drain process, so that gettering of metal ion contamination can be greatly improved.

Additional mask design tasks can also be reduced by using a mask task method for gettering.

Namely, boron ions with high dose may be implanted in the dummy moat region, and thus, the metal ion contamination is reduced by using Fe—B bonding, so that a leakage current occurring in an inner portion of silicon can be reduced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a CMOS image sensor, comprising steps of:
   forming an element isolation in a field region of a semiconductor substrate where a photodiode region, first and second conductivity type transistor regions, the field region, and a dummy moat region are defined;
   forming a photodiode in the photodiode region of the semiconductor substrate;
   forming a first conductivity type well region and a second conductivity type well region by implanting first and second conductivity type impurity ions in the first and second conductivity type transistor regions of the semiconductor substrate, respectively;
   forming a first gate electrode on the first conductivity type well region with a first gate insulating film interposed and a second gate electrode on the second conductivity type well region with a second gate insulating film interposed;
   forming a lightly doped first conductivity type impurity region in the second conductivity type well region at both sides of the first gate electrode and a lightly doped second conductivity type impurity region in the first conductivity type well region at both sides of the second gate electrode;
   forming a heavily doped second conductivity type first impurity region in the first conductivity type well region at both sides of the second gate electrode; and
   forming a heavily doped first conductivity type second impurity region in the second conductivity type well region at both sides of the first gate electrode and a heavily doped first conductivity type third impurity region in the dummy moat region simultaneously.

2. The method according to claim 1, wherein the heavily doped first conductivity type third impurity region is formed by implanting heavily doped p type impurity ions.

3. The method according to claim 2, wherein the heavily doped p type impurity ions are boron ions.

4. The method according to claim 2, wherein the first conductivity type well region is a P-well region.

5. The method according to claim 4, wherein the second conductivity type well region is an N-well region.

6. The method according to claim 5, wherein the lightly doped first conductivity type impurity region is a p type impurity region, and the lightly doped second conductivity type impurity region is an n type impurity region.

7. The method according to claim 1, further comprising a step of forming insulating film sidewalls on both sides of the first gate electrode and the second gate electrode.

* * * * *